US006285182B1

(12) United States Patent
Blake et al.

(10) Patent No.: US 6,285,182 B1
(45) Date of Patent: Sep. 4, 2001

(54) ELECTRO-OPTIC VOLTAGE SENSOR

(75) Inventors: James N. Blake, Scottsdale; Charles H. Lange, Glendale, both of AZ (US)

(73) Assignee: Nxtphase Technologies SRL, Phoenix, AZ (US)

( * ) Notice: Subject to any disclaimer, the term of this patent is extended or adjusted under 35 U.S.C. 154(b) by 0 days.

(21) Appl. No.: 09/207,371

(22) Filed: Dec. 8, 1998

(51) Int. Cl.[7] .................... G01R 31/00

(52) U.S. Cl. .................... 324/96; 324/750; 324/753

(58) Field of Search .................... 324/96, 750, 752, 324/244.1, 751, 753, 117 R; 385/2

(56) References Cited

U.S. PATENT DOCUMENTS

| | | | | |
|---|---|---|---|---|
| 3,466,541 | * | 9/1969 | Bernard et al. | 324/96 |
| 3,810,013 | * | 5/1974 | Miller | 324/96 |
| 5,267,336 | * | 11/1993 | Sriram et al. | 324/96 |
| 5,644,397 | | 7/1997 | Blake . | |
| 5,666,062 | * | 9/1997 | Takahashi et al. | 324/753 |
| 5,696,858 | | 12/1997 | Blake . | |
| 5,892,357 | * | 4/1999 | Woods et al. | 324/96 |
| 5,936,395 | * | 8/1999 | Kevorkian et al. | 324/96 |

* cited by examiner

*Primary Examiner*—Christine Oda
*Assistant Examiner*—Subhash Zaveri
(74) *Attorney, Agent, or Firm*—Robert A. Pajak

(57) ABSTRACT

A true dV/dt voltage sensor having no need for a ground reference for measurement. The sensor is connected at two places on the electric line to be measured. The voltage wave has a delay between the two places on the line and the difference is sensed and converted into a voltage measurement. Another approach is to connect the sensor at one place on the electric line. This approach has the second connection through a phase delay circuit that has an input connected to the same place. The delay between the one connection and the output of the phase delay circuit is sensed and converted into a voltage measurement. The sensed difference is a voltage, which is applied across a device, such as an electro-optic crystal, an integrated optic circuit (IOC) or a Mach Zehnder interferometer, which is a light medium that has a birefringence or an index of refraction that varies with changes of applied voltage. The variation of birefringence changes the polarization state of the light going through the device. The intensity of at least one polarization of light is detected and converted to an electrical signal. The intensity of the two interfering light beams from the legs of the Mach Zehnder interferometer is a function of the measured voltage. The electrical signal is integrated into a signal indicative of the magnitude of the voltage being measured on the electric line.

34 Claims, 14 Drawing Sheets

ELECTRO-OPTIC VOLTAGE SENSOR

BACKGROUND

The invention pertains to sensors for measuring voltages. Particularly, it pertains to fiber optic sensors, and more particularly to such sensors not having a ground reference for measurements, and more particularly to such sensors have a time delayed self-reference.

One of the main difficulties of optical methods of sensing high voltage is related to the fact that optical sensors are typically inherent electric field sensors. In order to measure a ground-to-line voltage, the typical optical sensor needs to integrate the electric field over the entire distance from the ground to the voltage line. This approach requires that the entire voltage be dropped across the optical sensor. This is difficult and dangerous for application areas such as high voltage transmission lines. One solution to this problem is to implement a form of field control (e.g., capacitive dividers) such that a local electric field spanning the optical sensor is a fixed or a well-known proportion of the entire field. However, the latter approach adds considerable complexity and uncertainty to voltage measurements.

SUMMARY OF THE INVENTION

The present invention is a true dV/dt voltage sensor. There is no need for using a ground reference to measure high voltages with the present sensor. The sensor is connected at two places on the voltage line to be measured. The voltage wave has a delay between the two places on the line and the difference is optically sensed and converted into a voltage measurement.

Another approach is to connect the sensor at only one place on the voltage line. The other connection to the sensor is through time delay circuit that has an input connected to the same place. The delay between the one connection and the output of the time delay circuit is optically sensed and converted into a voltage measurement. The sensed difference is a voltage, which is applied across a device, such as an electro-optic crystal or an integrated optic circuit (IOC), which is a light medium that has a birefringence that varies with changes of applied voltage. The variation of birefringence changes the polarization state of the light going through the device. The intensity of at least one polarization of light is detected and converted to an electrical signal.

Still another approach is to have the sensing device as an IOC which includes a Mach Zehnder interferometer, which is a pair of optical wave guides that has a phase modulation that varies with changes in applied voltage. This phase modulated beam interferes with an unmodulated or differently modulated beam producing an intensity modulation. The intensity is detected and converted to an electrical signal. The electrical signal is integrated into a signal indicative of the voltage being measured.

DESCRIPTION OF THE EMBODIMENTS

The following formulas indicate a mathematical representation of the signals used. "$V(t)$" is the voltage at point 21 referenced to ground. "$V(t+\tau)$" is the voltage at point 22 referenced to ground. "$\tau$" is the difference in time for a voltage wave incident on point 21 to be incident on point 22, "$\tau$" can be "+" or "−" depending on the direction of travel of the voltage wave. "I1" is intensity of polarized light passing through the polarized beam splitter (PBS) and "I2" is the intensity of light polarized reflected by the PBS.

Figure 1A:
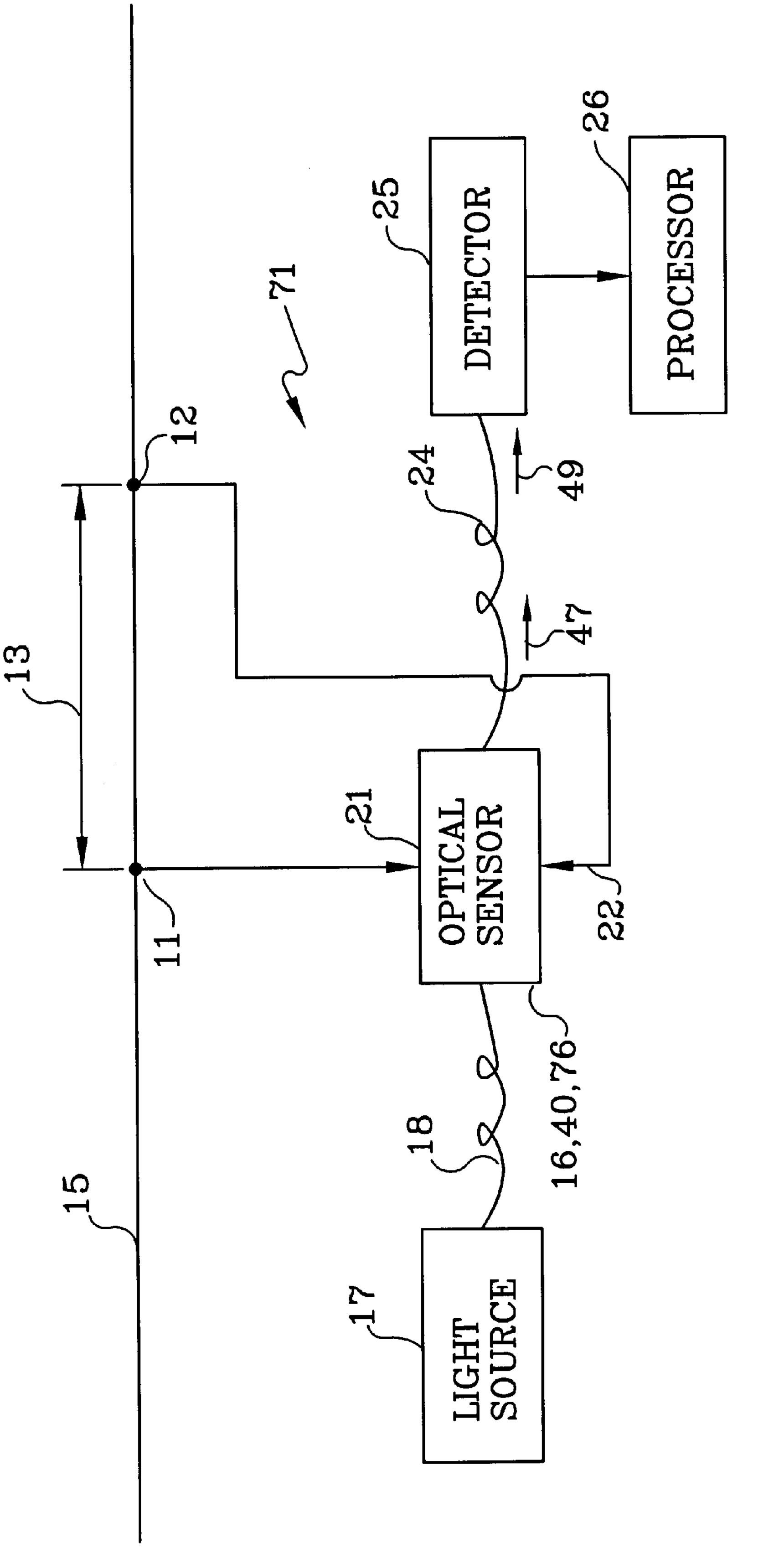
FIG. 1*a* shows a voltage sensor that measures voltage by monitoring two points on a voltage line.

FIG. 1*a* reveals a fiber optic voltage sensor 71, which avoids the problem of integrating the field from ground to the line. The sensor consist of a light source 17 which may be generated by a laser, super luminescent diode, or fiber light source, a fiber 18 to transport the light, and optical sensing device 16 with support optics to convert change in optical properties to an intensity change, and fiber 24 to transport the light to a detector 25 to convert the optical signal to an electrical signal, and electronics 26 to process the signal. The voltage across sensing element 16, which is between connections 21 and 22, is $V(t)-V(t+\tau)$. The voltage $V(t)$ at point 21 is compared to the voltage $V(t+\tau)$ at point 22. The distance between points 11 and 12 may be any distance necessary to produce a large enough voltage difference and produce a fast time response (i.e., between ten centimeters and thirty meters).

Figure 1B:
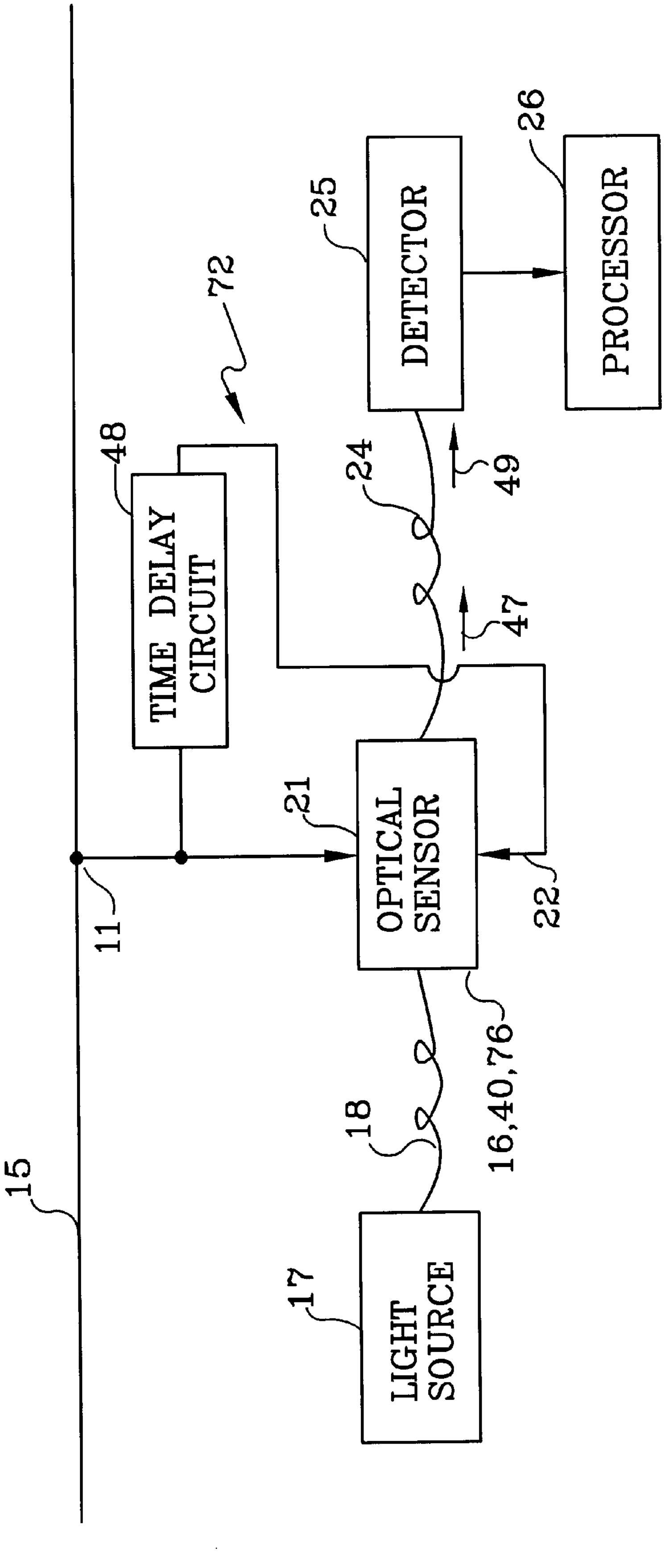
FIG. 1*b* shows the voltage sensor of FIG. 1*a*, by monitoring only one point on the voltage line using a generic optical voltage sensor, relative to a delay.

FIG. 1*b* shows a voltage sensor 72 connected at one point 11 on voltage line 15. A time delay, moving time average or a phase delay circuit 48 introduces a voltage signal difference between point 21 and input 22 of sensor 16. A signal $V(t)$ from point 21 and a signal $V(t+\tau)$ from circuit 48 are input to optical sensing element 16. This delay is like the delay between points 21 and 22 of FIG. 1*a*.

Element 16 of both 1*a* and 1*b* may be a distributed or integrated sensor which includes an electro-optic crystal, a piezoelectric device or an IOC, which has a birefringence that varies with applied voltage, or another electro-optic device which is sensitive to voltage differences such as a Mach Zehnder interferometer. The devices in element 16 may be bulk optics, integrated optics or guided wave optics. The medium of element 16 affects the polarization state, phase or other optical property of the light propagating through the medium and includes optical components necessary to convert the change in optical property to an optical signal 47 (i.e., intensity change). An optical signal 47 goes from element 16 via fiber 24 to the detector 25. An electrical representation of optical signal 49 goes to processor 26 converted into the desired output. An integrator may be incorporated within processor 26 or may be an integrator 27 apart from processor 26.

Figure 2A:
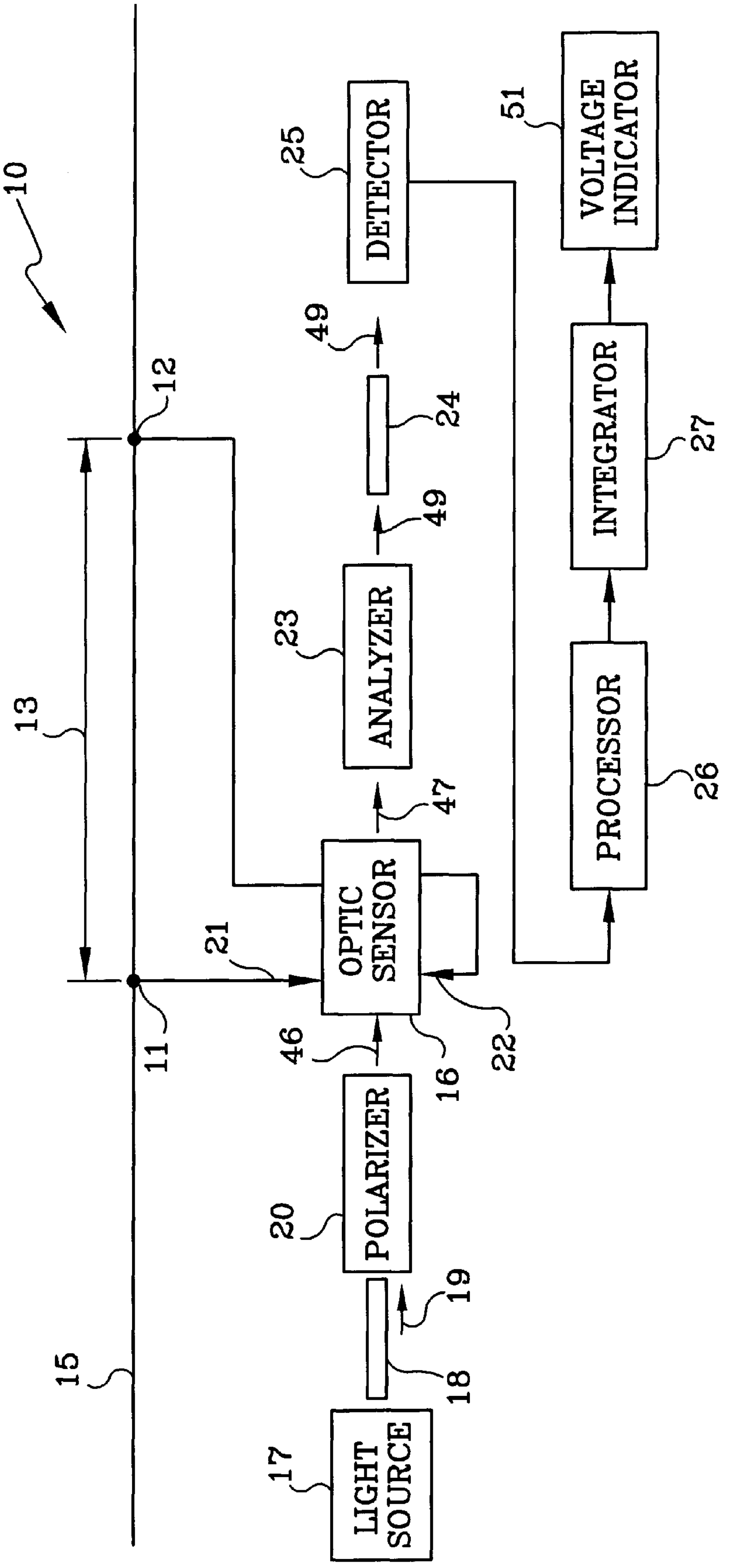
FIG. 2*a* shows a voltage sensor that measures voltage by monitoring two points on a voltage line.
Figure 2B:
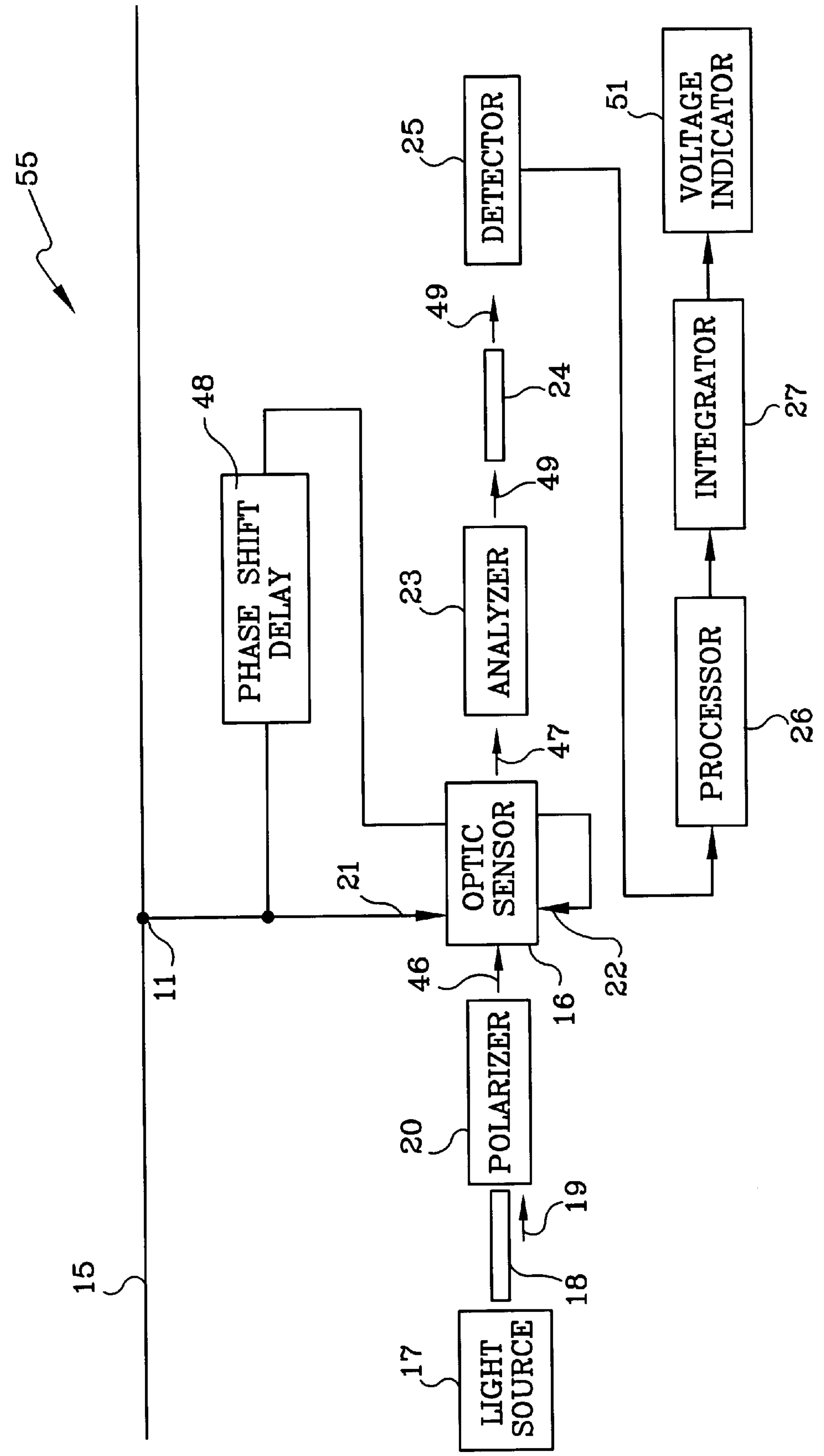
FIG. 2*b* shows the voltage sensor of FIG. 2*a*, by monitoring only one point on the voltage line relative to a delay.

FIG. 2*a* shows a sensor connected to the voltage line like sensor 71 in FIG. 1*a*. Light source 17, which may be generated by a laser, super luminescent diode, outputs a light beam 19 into a multimode fiber 18. From fiber 18, beam 19 goes into polarizer 20. From polarizer 20, polarized light beam 46 goes to electro-optic sensor 16. The birefringence axes of polarizer 20 and sensor 16 are aligned at 45 degrees relative to each other. Sensing element 16 can be any kind of an electrical field sensitive element, which changes its optical properties of the transmission of light in response to an electric field caused by a voltage applied across the element through end plates or side electrodes 21 and 22. The measurement is based on a comparison of one voltage measurement with a time-shifted version of itself. A significant advantage of sensor 10 is that it does not need a ground reference; it is time-delayed, self-referenced. A length 13 of voltage line 15 between connections 11 and 12 plus the delay difference associated with the sensor leads or a phase shift delay circuit 48 of FIG. 2*b* provides the delay time.

In FIG. 2*a*, an optical sensing element 16 has a first input 21 connected to point 11 of voltage line 15 down which a voltage wave travels. Element 16 has a second input 22 connected to point 12 of voltage line 15, wherein the voltage wave travels in the direction from point 11 to point 12. Sensing element 16 may be composed of an electro-optic crystal or piezoelectric material which changes the phase or polarization of light through birefringence modulation of the sensor medium through which light beam 46 propagates, and affects the relationship of the two polarizations of light that passes through the light medium or material in response to the voltage across the material.

Sensing element 16 may have either bulk or guided wave optics. An electro-optic crystal (i.e., a Pockels cell) can be as element 16. Here, the electro-optic crystal 16 utilizes the Pockels cell effect to change the birefringence of the light medium through which light beam 46 travels. The polarization state of light beam 46 is affected by crystal or optic sensor 16 and is a function of the electric field of the applied voltage across the sensor from connections 21 and 22. Birefringently modulated light beam 47 goes on to analyzer 23 which is effectively a polarizer which passes only light of a certain polarization. This light output is beam 49, which is conveyed by multi-mode fiber 24 to detector 25.

Detector 25 converts beam 49 into an electrical signal representative of beam 49. The electrical signal goes to processor 26. The output of processor 26 is a signal which represents the birefringence modulation that is caused by the electro-optic sensor due to the electric field of the voltage being measured, and is proportional to a time derivative of the line voltage. Integrator 27 integrates the signal from processor 26 into a signal that is proportional to the line voltage at point 11. The integrator 27 output signal in effect represents the voltage being measured. The integrator 27 signal goes to voltage indicator 51 that provides a direct reading of the measured voltage.

FIG. 2*b* shows an in-line voltage sensor 55, which is like that of sensor 10 of FIG. 2*a*, except sensor 55 has only one connection 11 to line 15. Connection 11 goes directly to electrode 21 of optic sensor 16. The signal to electrode 22 of optic sensor 16 is from a time delay circuit 48, which may be a simple time delay line. The input of time delay circuit 48 is connected to connection 11 of voltage line 15. This time delay permits birefringence modulation of the medium in sensor 16 by providing signals to electrodes 21 and 22 thereby resulting in an electric field across the crystal in accordance with the voltage differential between connection 11 and the output of phase shift delay circuit 48. Output signal 47 of electro-optic sensor 16 is processed like signal 47 of sensor 10 in FIG. 2*a*.

Figure 3A:
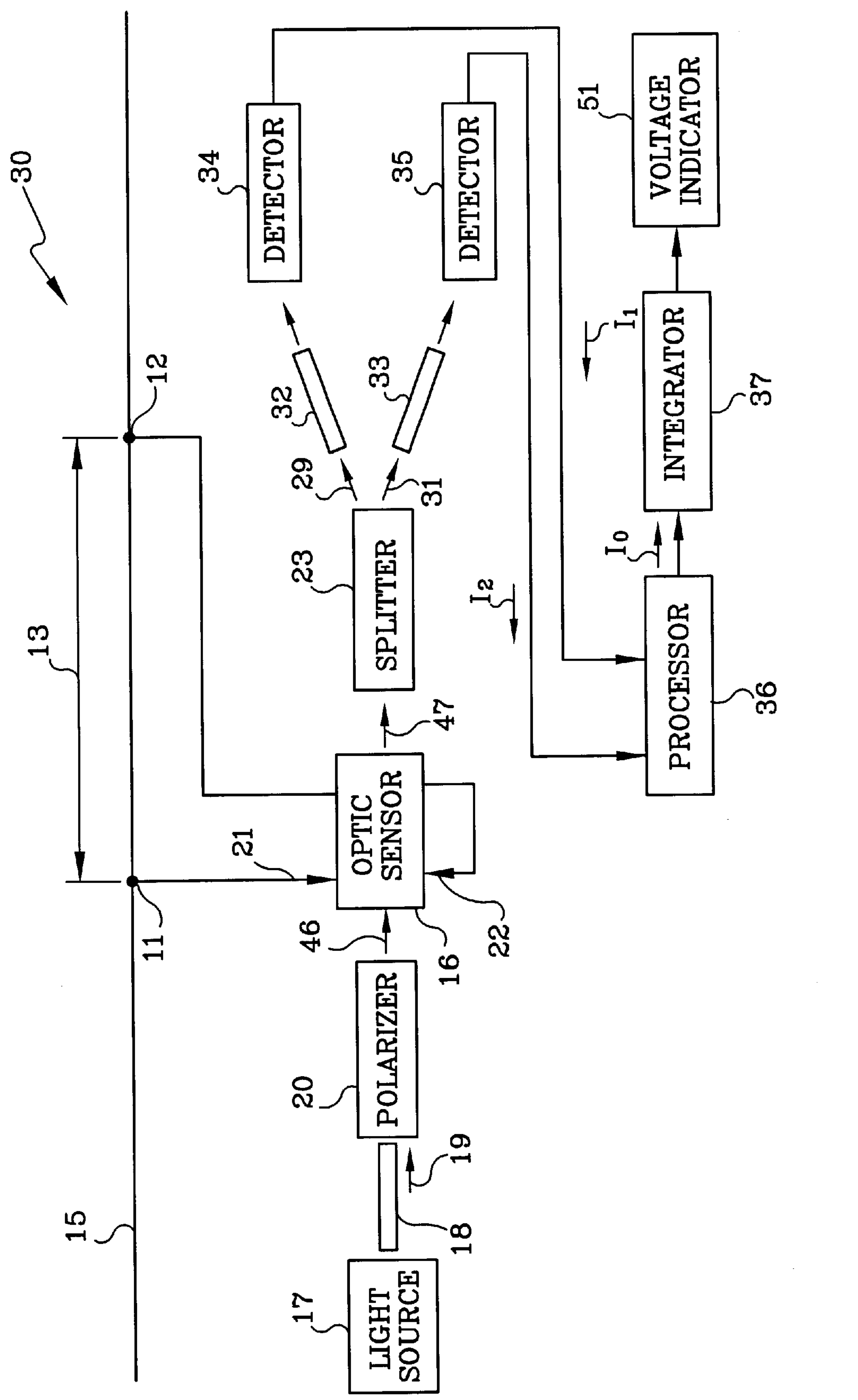
FIG. 3*a* shows a voltage sensor that has a two-polarization light detector and measures voltage by monitoring two points on a voltage line.
Figure 3B:
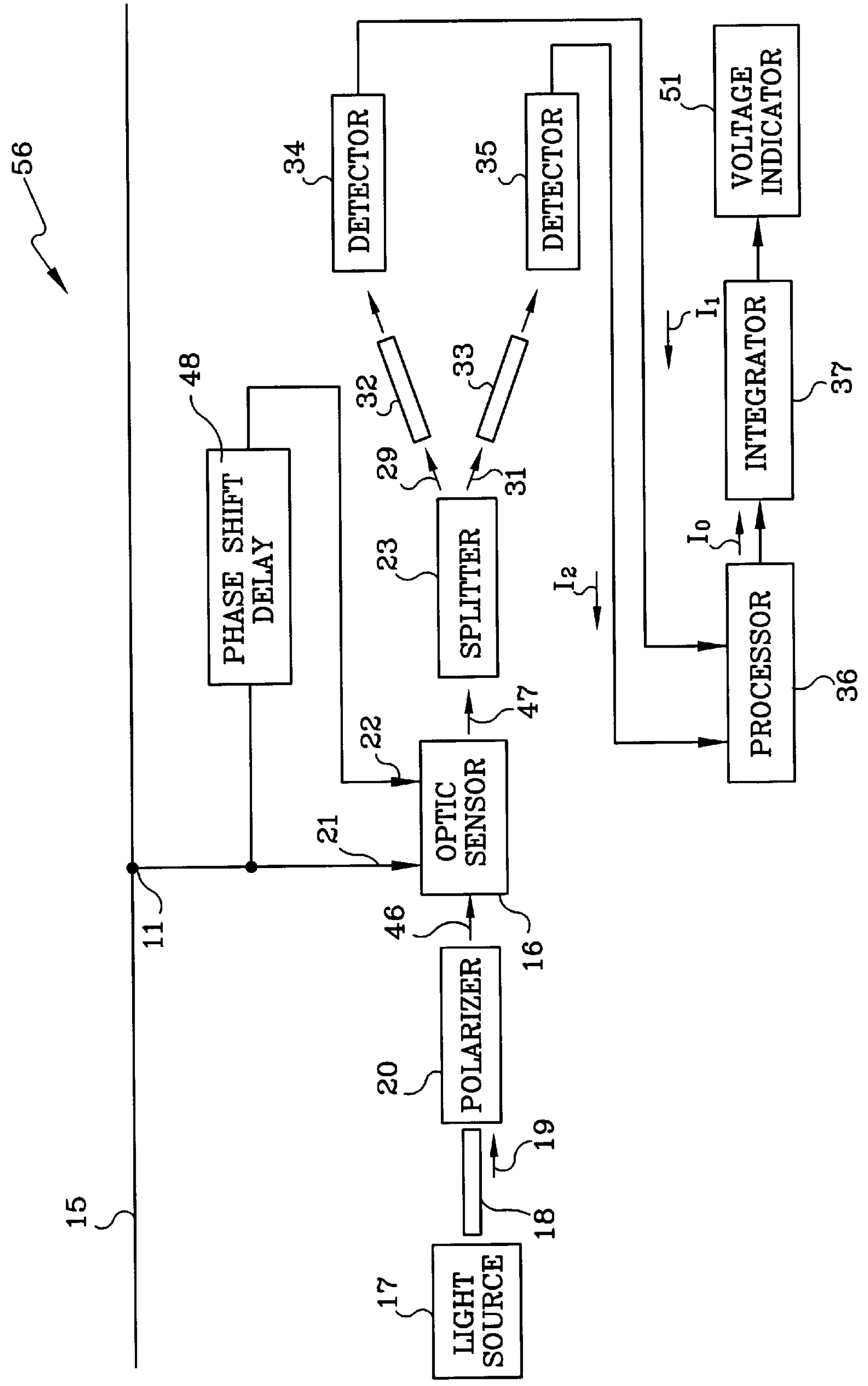
FIG. 3*b* shows the voltage sensor of FIG. 3*a*, but measures voltage by monitoring only one point on the voltage line relative to a delay.

FIGS. 3*a* and 3*b* show configurations 30 and 56, respectively, using guided, bulk optics light systems. A light source 17 emits light 19 via a multi-mode fiber 18 to be polarized by polarizer 20. There is a 45-degree orientation of birefringence axes between polarizer 20 and optic sensor 16, for providing light in two polarization modes to sensor 16. Light 46 passes through a crystal of sensor 16. In FIG. 3*a*, a top side plate electrode 21 on sensor 16 is connected to point 11 on line 15 and a bottom side plate electrode 22 is connected to point 12 on line 15.

In FIG. 3*b*, sensor 56 is a single connection self-referenced measuring device. Electrode or plate 21 is connected to point 11 and plate or electrode 22 is connected to an output of time (or phase shift) delay circuit or delay line 48. The input of circuit 48 is connected to point 11 of voltage line 15 and output connected to point 22 of element 16. Crystal 16 has a birefringence that changes with an applied voltage across plates 21 and 22, and thus the polarization state of the light 47 is a function of the applied voltage across the plates, like that of FIG. 3*a*.

The processing of light signal 47 is the same for configurations 30 and 56 of FIGS. 3*a* and 3*b*. Light 47 goes through a polarization sensitive splitter 28 that outputs light 29 of a first polarization in a first direction into a multi-mode fiber 32. Splitter 28 also outputs a light 31 of a second polarization in a second direction into a multi-mode fiber 33. Fibers 32 and 33 may instead be single mode, non-polarization-maintaining fibers or aligned PM fibers. Light beams 29 and 31 go to detectors 34 and 35, respectively. Detectors 34 and 35 may be photodiodes that convert light signals into representative electrical signals or currents $I_1$ and $I_2$, respectively. The electrical signal from detector 34 represents the intensity of light signal 29 in the first polarization and the electrical signal from detector 35 represents the intensity of light signal 31 in the second polarization. Processor 36 processes these signals into a signal $I_o$ as shown by the equation $[(I_1-I_2)/(I_1+I_2)]=I_o$. The output signal $I_o$ of processor 36 represents a time derivative of the electric field in sensor 16. The output of sensor 16 is integrated by device 37 into a signal that goes to voltage indicator 51 that output a value that is proportional to the voltage on line 15.

FIGS. 4*a*, 4*b*, 5*a* and 5*b* reveal in-line voltage sensors having an integrated optical circuit (IOC) 40 as an elecro-optic sensor in lieu of the crystal sensor 16 of FIGS. 2*a*, 2*b*, 3*a* and 3*b*. In configuration 50, light source 17 of FIG. 4*a* emits a broadband light beam 42, which may be generated by a laser, super luminescent diode, or fiber light source, into polarizer 38. Polarizer 38 may be made from polarizing optical fiber. Polarized light beam 46 enters IOC 40 that has waveguide polarization maintaining properties. The birefringence polarization axes of polarizer 38 are aligned at 45 degrees relative to the axes of IOC 40 at connection 39, such that there is an even distribution of light in the first and second polarizations, as it begins to propagate through the IOC. A first voltage signal from connection 11 on voltage line 15 goes to electrode 43 via connection 21 of IOC 40. A second voltage signal from connection 12 on line 15 goes to electrode 44 via connection 22 of IOC 40. The difference of the voltage signal from point 11 along a distance 13 to point 12 of line 15 results in a certain amount of time (or phase) delay in the voltage signal propagating from point 11 to point 12. This delay plus the difference in delay of the leads to point 21 and 22 produces a voltage difference or signal. This voltage difference is a voltage present on electrodes 43 and 44, which birefringently modulates the light medium of IOC 40 which in turn affects the polarization of the light beam propagating through the IOC.

A birefringently modulated light beam 47 of two polarizations exits IOC 40 and enters a PM optical fiber 58. The principal birefringence axes of fiber 58 are aligned at 45 degrees relative to the principal birefringence axes of IOC 40 at connection 41. Light beam 52 exits fiber 58 and enters a polarization sensitive beam splitter 28. Light from beam 52 in the first polarization is split off as light beam 29. Light from beam 52 in the second polarization is split off as light beam 31. Light beam 29 enters a photo detector 34 and is converted into an electrical signal representative of beam 29. Light beam 31 enters a photo detector 35 and is converted into an electrical signal representative of beam 31. The electrical signals from detectors 34 and 35 go to processor 36 to be processed into one signal that is integrated by integrator 37. The integrated signal goes to voltage indicator 51 to provide a reading of the voltage measured on voltage line 15.

Figure 4A:
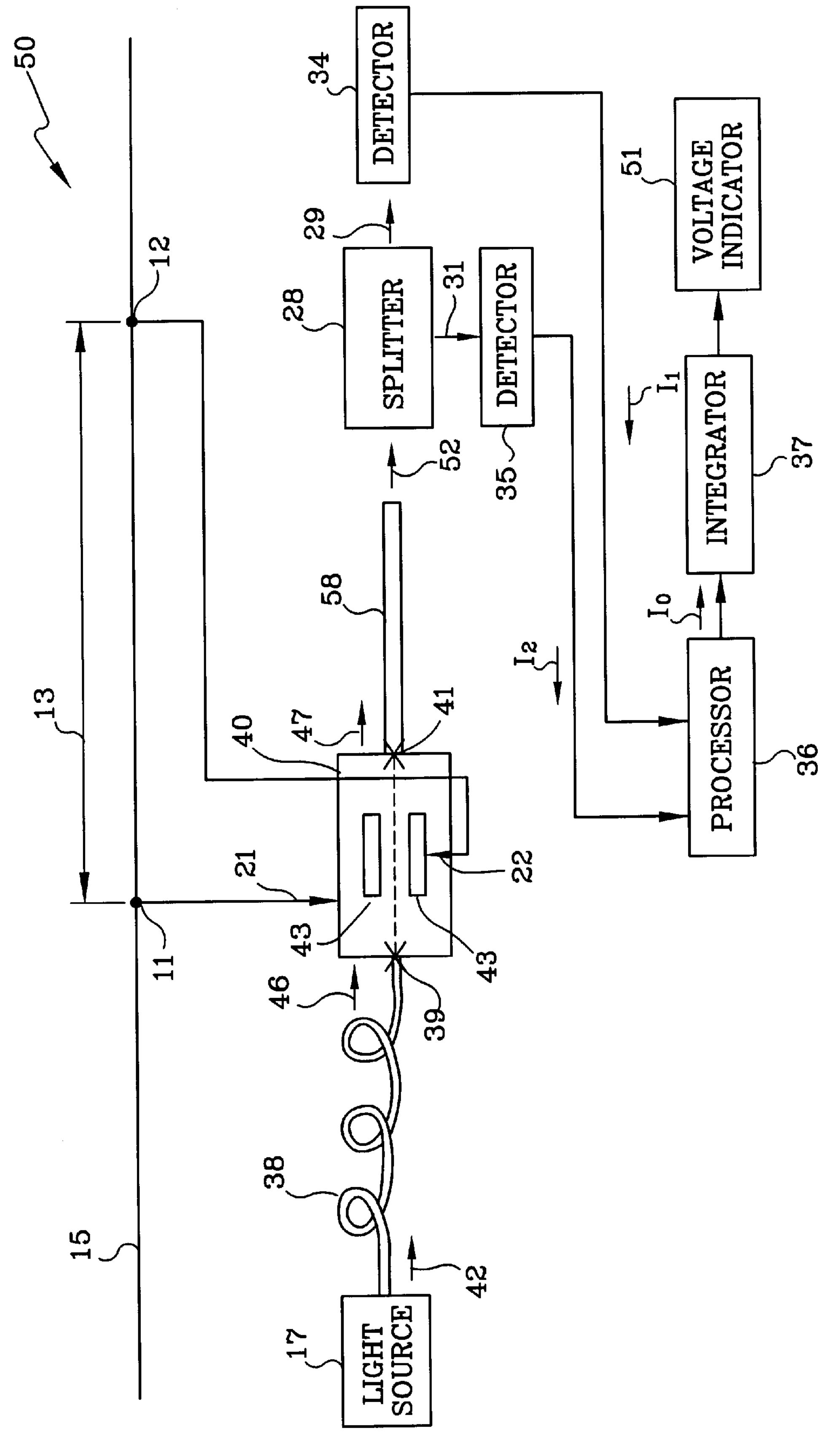
FIG. 4*a* shows a voltage sensor that has an integrated optical circuit for sensing, and measures voltage by monitoring two points on a voltage line.
Figure 4B:
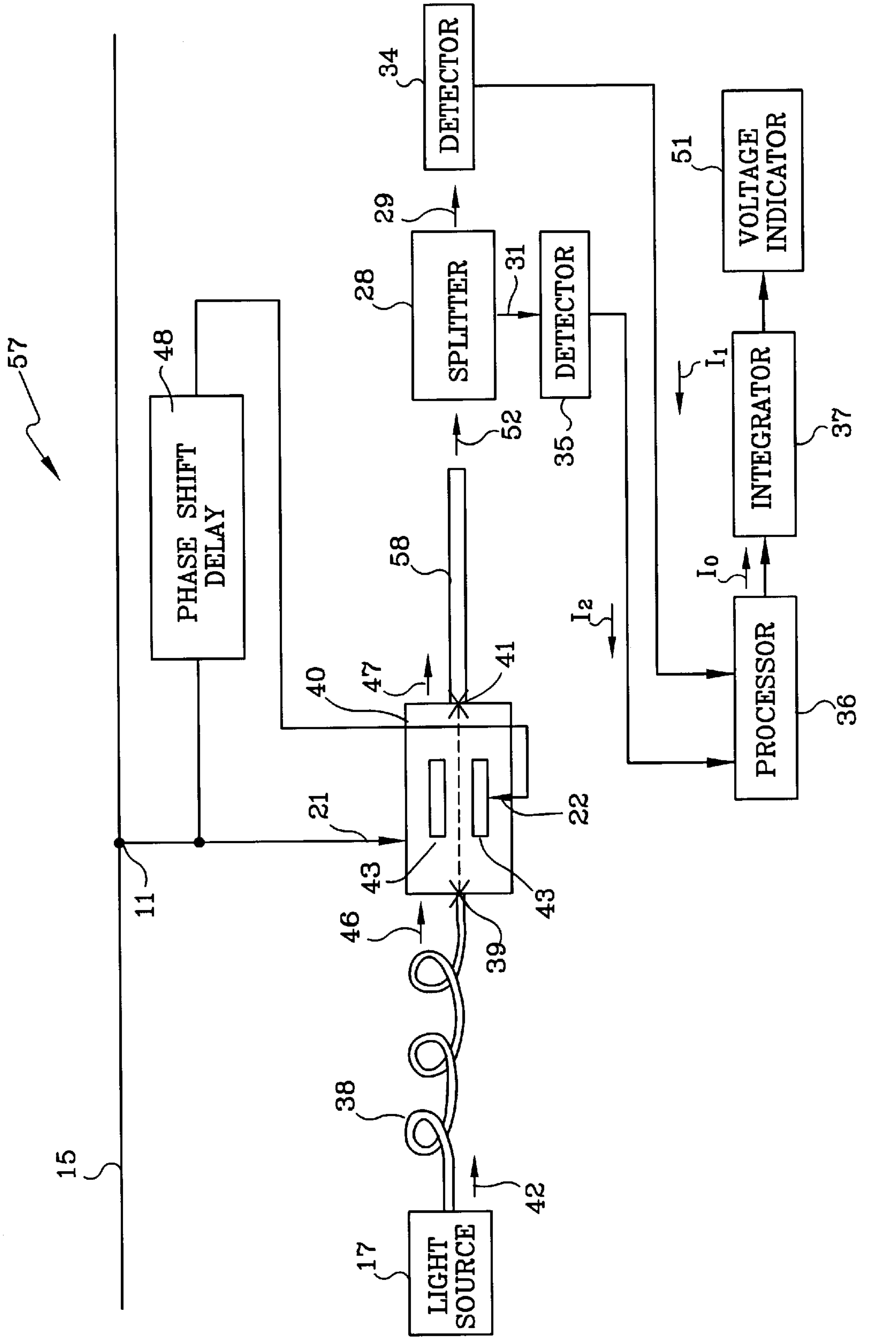
FIG. 4*b* shows a voltage sensor like that of FIG. 4*a*, but measures voltage by monitoring only one point on the voltage line relative to a delay.

Configuration 57 of FIG. 4*b* is similar to configuration 50, except that there is only one connection 11 to voltage line 15 for taking a voltage measurement. Broadband light beam 42 from source 17 goes through polarizer 38 and exits the polarizer as polarizer beam 46. Polarizer 38 is connected to IOC 40 having its principal birefringence axes aligned at 45 degrees with the principal birefringence axes of the TOC at connection 39, so light is distributed in two polarization modes as it enters IOC 40. Electrode 43 via connection 21 is connected to line 15 at point 11. The other electrode 44 via connection 22 is connected to line 15 at point 11 via a time (or phase shift) delay circuit 48. Circuit 48 provides a delay in time of the voltage signal on line 15 to simulate the delay of the signal between points 11 and 12 along length 13 plus difference in lead delays of FIG. 4*a*. Electrodes 43 and 44 birefringently modulate the light relative to its polarizations according to the electrical signals at IOC connections 21 and 22. Birefringently modulated light beam 47 exits IOC 40 to PM fiber 58. PM fiber 58 has its principal birefringence axes aligned at 45 degrees relative to the birefringence axes of IOC 40 at connection 44.

Light beam 52 exits fiber 58 and goes to splitter 28. Light beam 52 is split by polarization sensitive splitter 28 into beams 29 and 31 of first and second polarizations, respectively, which go to photo detectors 34 and 35. The electrical signals, representative of light beams 29 and 31, are processed by processor 36 into one electrical signal like that of $I_o$ as shown above for configurations 30 and 56. Output signal $I_o$ of processor 36 is integrated by integrator 37. The integrated signal goes to voltage indicator 51 for a measurement reading of the voltage at point 11 on line 15.

Figure 5A:
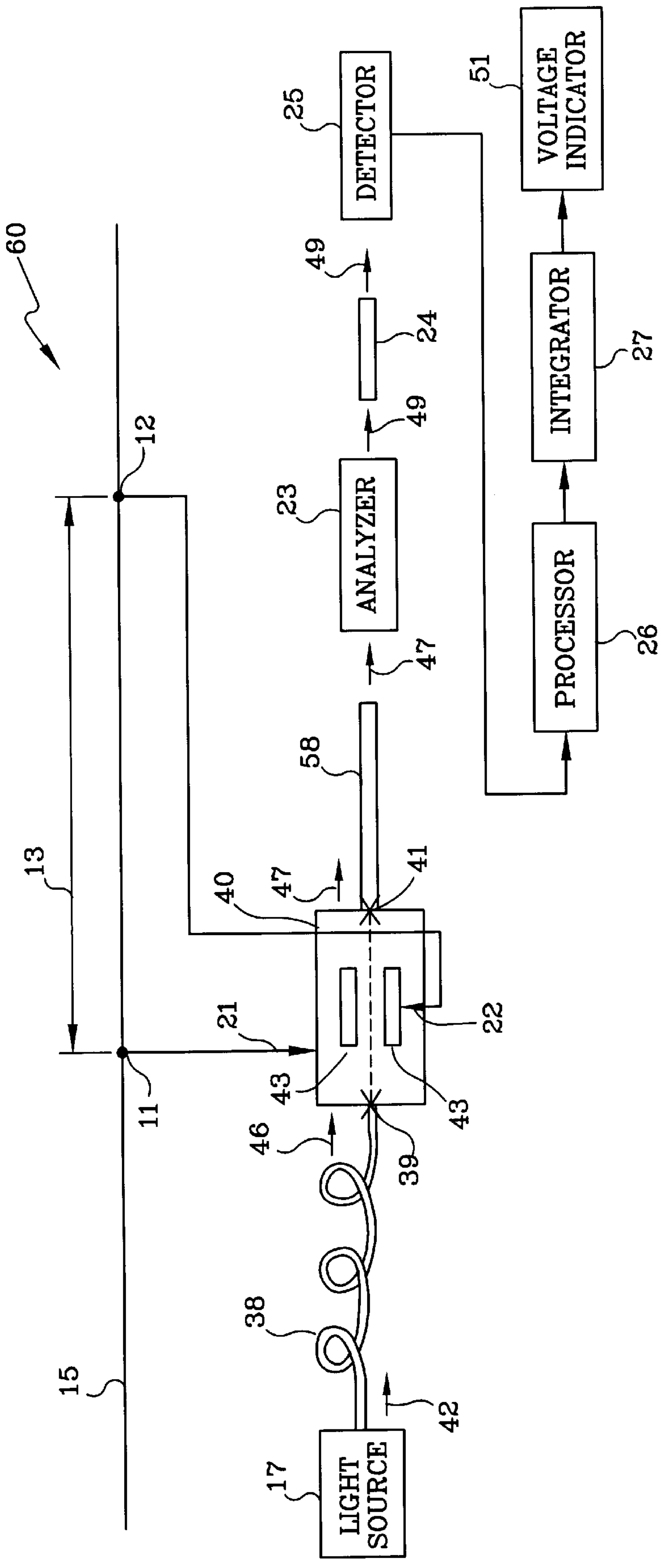
FIG. 5*a* mshows a voltage sensor like that of FIG. 4*a*, except the output of the integrated optical circuit is processed like the output of the electro-optic sensor of FIG. 2*a*.

FIG. 5*a* shows a configuration 60 that is similar to configuration 50 of FIG. 4*a*, but light beam 47 from IOC 40 is processed in a manner similar to that of configuration 10 in FIG. 2*a*. Birefringently modulated light beam 47 goes on to analyzer 23 which is effectively a polarizer which passes only light of a certain polarization. This light is beam 49, which is conveyed by multi-mode fiber 24 to detector 25. Detector 25 converts beam 49 into an electrical signal representative of beam 49. The electrical signal goes to processor 26. The output of processor is a signal which represents birefringence modulation that is caused by the electro-optic sensor due to the electric field of the voltage being measured, and is proportional to a time derivative of the line voltage. Integrator 27 integrates the signal from processor 26 into a signal that is proportional to the electric field of the voltage across crystal 16. The integrator 27 output signal in effect represents the line voltage being measured. The integrator 27 signal goes to voltage indicator 51 that provides a direct reading of the voltage being measured.

Figure 5B:
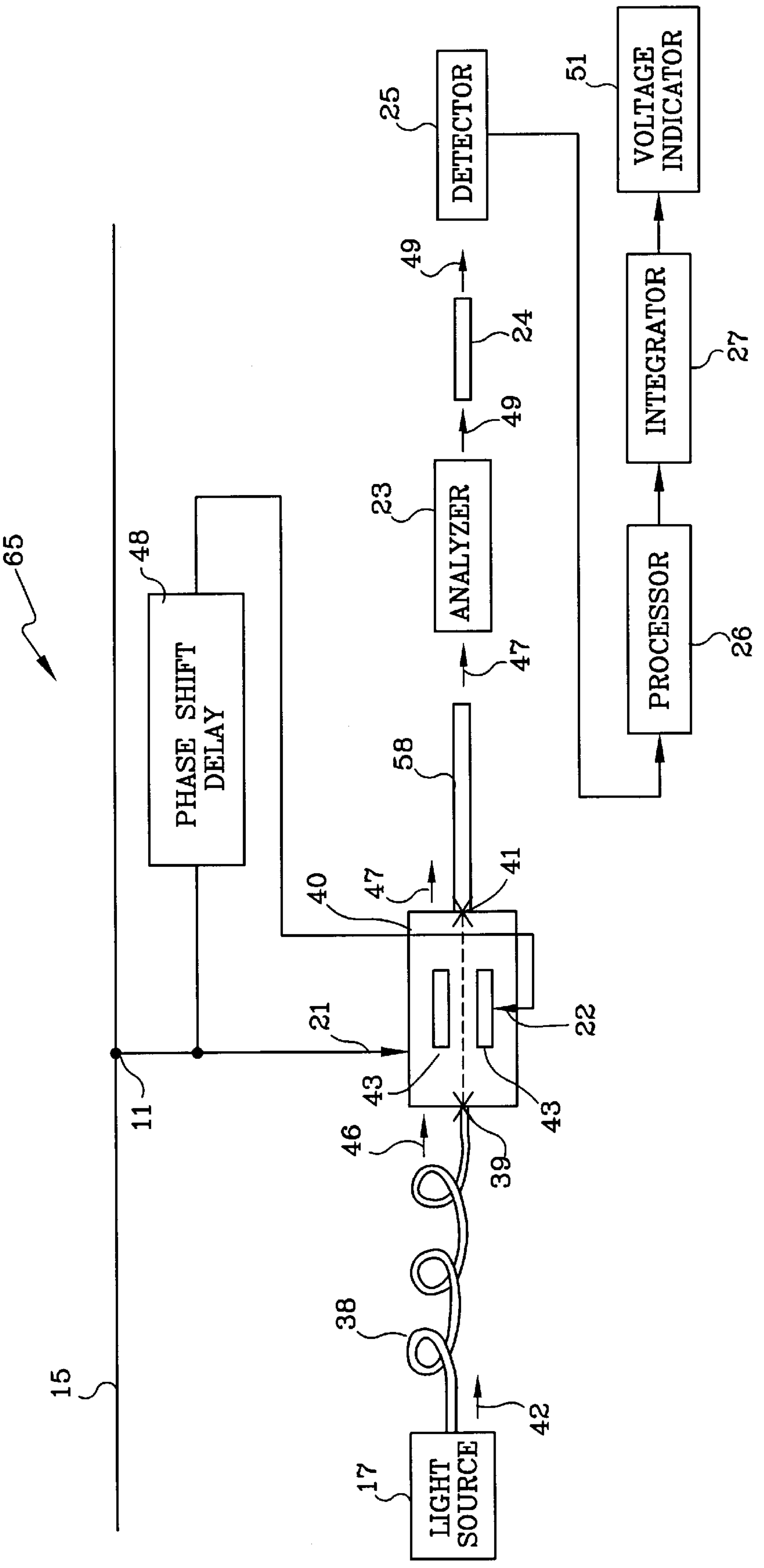
FIG. 5*b* shows a voltage sensor like that of FIG. 5*a*, except that the voltage is measured by monitoring only one point on the voltage line relative to a delay.

FIG. 5*b* shows a configuration 65 with which a single connection 11 is similar to that configuration 57 of FIG. 4*b*, but light beam 47 from IOC 40 is processed like that of configuration 55 in FIG. 2*b*.

Figure 6A:
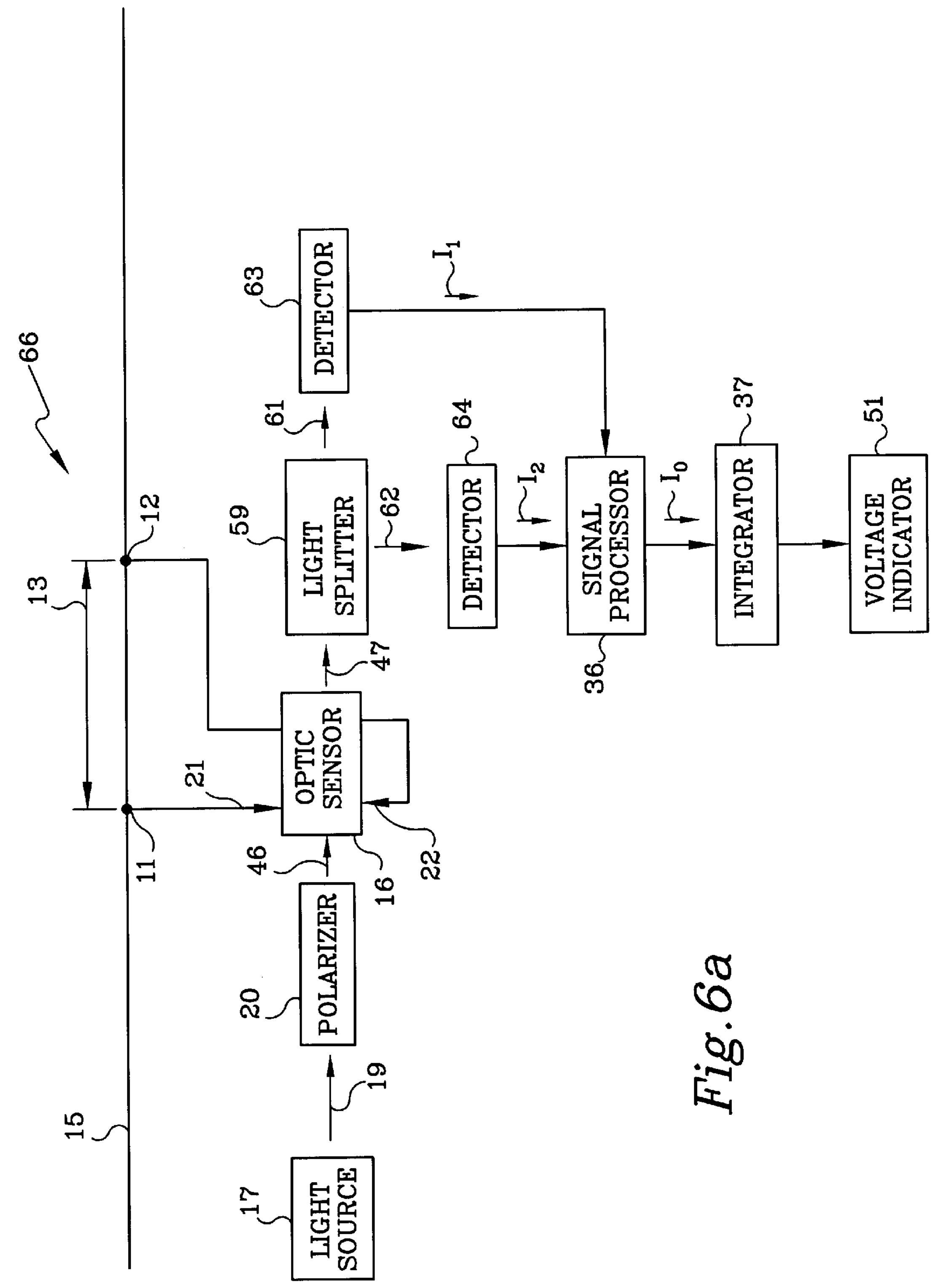
FIG. 6*a* shows a voltage sensor having a bulk optics configuration and monitors two points of the voltage line.

FIG. 6*a* shows a bulk optics configuration 66 of the voltage sensor. Light 19 from source 17 goes to polarizer 20. Polarized light 46 goes from polarizer 20 to optic sensor 16. Electro-optic sensing element 16 has first input 21 connected to point 11 of voltage line 15 down which a voltage wave travels. Element 16 has second input 22 connected to point 12 of voltage line 15, wherein the voltage wave travels in the direction from point 11 to point 12. Sensing element 16 may be composed of an electro-optic crystal, piezoelectric material, or an IOC adapted to interface with bulk optics. Sensing element 16 changes the phase or polarization of light through birefringence modulation of the sensor medium through which light beam 46 propagates, and affects the relationship of the two polarizations of light that passes through the light medium or material in response to the voltage across the material. The polarization state of light beam 46 is affected by sensor 16. The polarization state is a function of the electric field of the applied voltage across the sensor from connections 21 and 22.

Birefringently modulated light beam 47 goes on to a polarization sensitive beam splitter 59. Beam 41 is spit in to a beam 61 having a first polarization and a beam 62 having a second polarization. Beam 61 is converted into an electrical signal $I_1$ representative of beam 61 by detector 63. Beam 62 is converted into an electrical signal $I_2$ representative of beam 62 by detector 64. Processor 36 processes signals $I_1$ and $I_2$ into a signal $I_o$ as shown by the equation $[(I_1-I_2)/(I_1+I_2)]=I_o$. Output signal $I_o$ of processor 36 represents a time derivative of the electric field in sensor 16. The output processor 36 is integrated by device 37 into a signal that goes to voltage indicator 51 that shows a numerical value of the voltage.

Figure 6B:
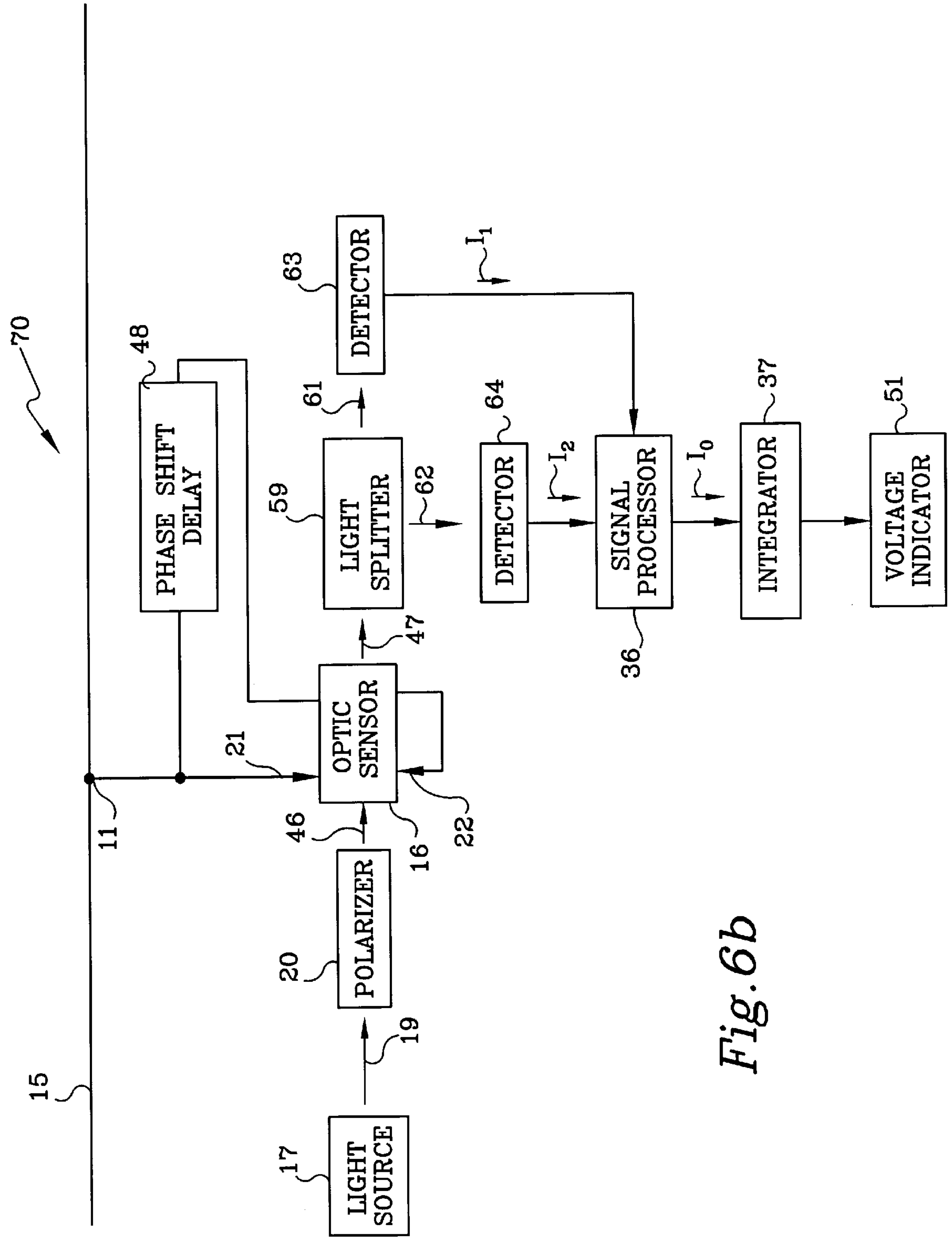
FIG. 6*b* shows a voltage sensor like that of FIG. 6*a*, except that the voltage is measured by monitoring only one point on the voltage line relative to a delay.

Configuration 70 of FIG. 6*b* is like configuration 66 of FIG. 6*b* except it has only one connection 11 to voltage line 15. Connection 11 goes directly to electrode 21 of optic sensor 16. The signal to electrode 22 of optic sensor 16 is from a phase shift/time delay circuit 48 that may be a delay line. The input of phase shift delay circuit 48 is connected to connection 11 of voltage line 15. This phase shift delay permits birefringence modulation of the medium in sensor 16 by providing signals to electrodes 21 and 22 thereby resulting in an electric field across the crystal in accordance with the voltage differential between connection 11 and the output of phase shift delay circuit 48. Output signal 47 of electro-optic sensor 16 is processed like that of sensor 66 in FIG. 6*a*.

Figure 7A:
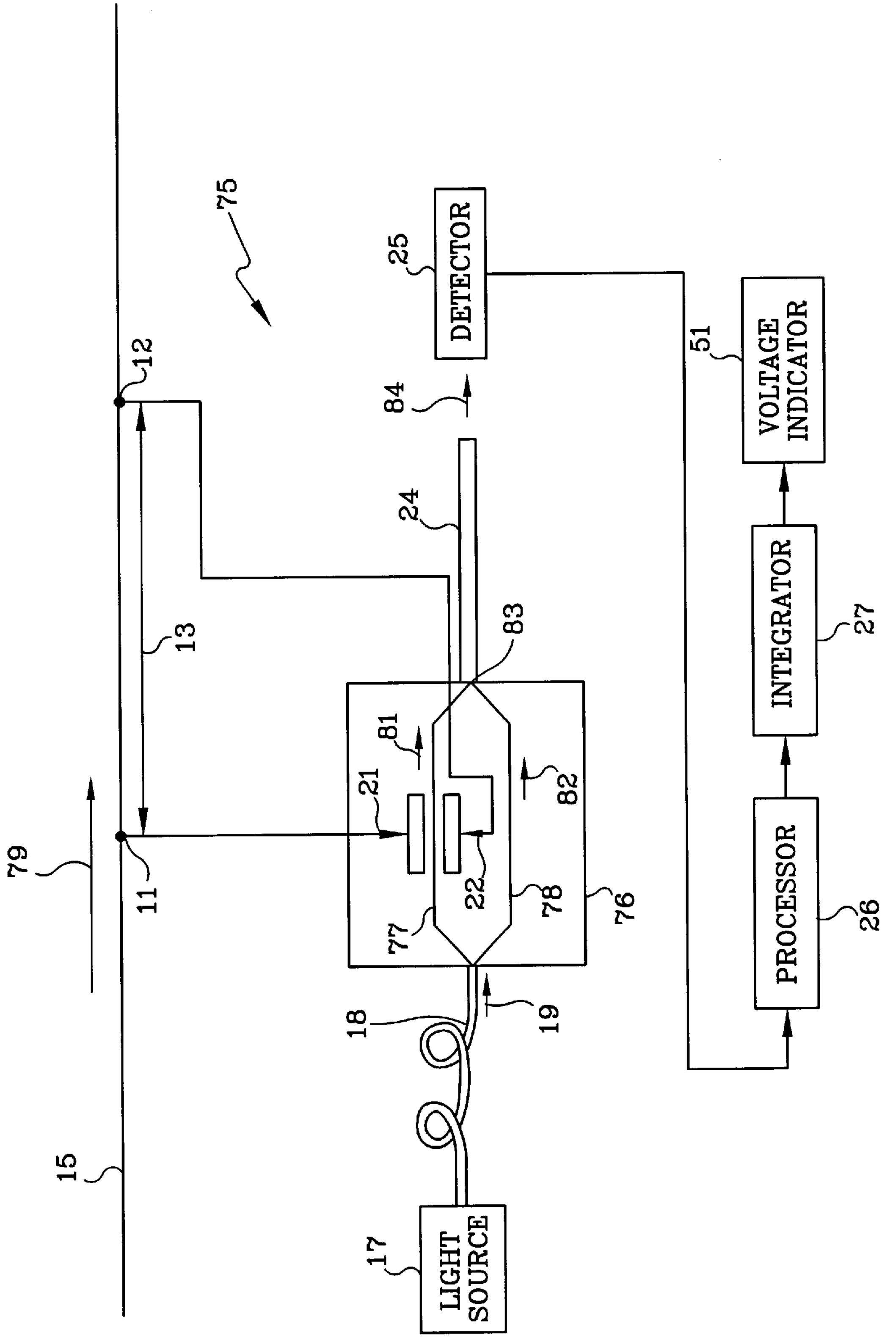
FIG. 7*a* shows a voltage sensor having a Mach Zehnder interferometer as the optical sensor and monitors two points of the voltage line.

FIG. 7*a* shows a Mach Zehnder configuration 75 of the voltage sensor. Light 19 from source 17 goes to sensing element 76 that is a Mach Zehnder interferometer. Electro-optic sensing element 76 has first input 21 connected to point 11 of voltage line 15 down which a voltage wave travels. Element 76 has second input 22 connected to point 12 of voltage line 15. Sensing element 76 may be composed of an electro-optic crystal, piezoelectric material, or an IOC configuration to make a Mach Zehnder interferometer. Sensing element 76 changes the effective index of refraction of one leg 77 of the sensor medium relative to the other leg 78 through which light beam 46 propagates. This change in index of refraction affects the phase relationship of light beams 81 and 82 that pass through two legs 77 and 78, respectively, of the interferometer differently in response to the voltage across the material. The two light beams 81 and 82 interfere at juncture 83 creating an intensity of light 84 that is related to the voltage applied to sensing element 76. Light 84 goes through fiber 24 to detector 25. Output light 84 of sensor 76 is converted into an electrical signal by detector 25. The detector 25 output is proportional to a time derivative of the measured line voltage. Processor 26 and integrator 27 convert the signal into a signal that goes to voltage indicator 51 depicting the line voltage.

Figure 7B:
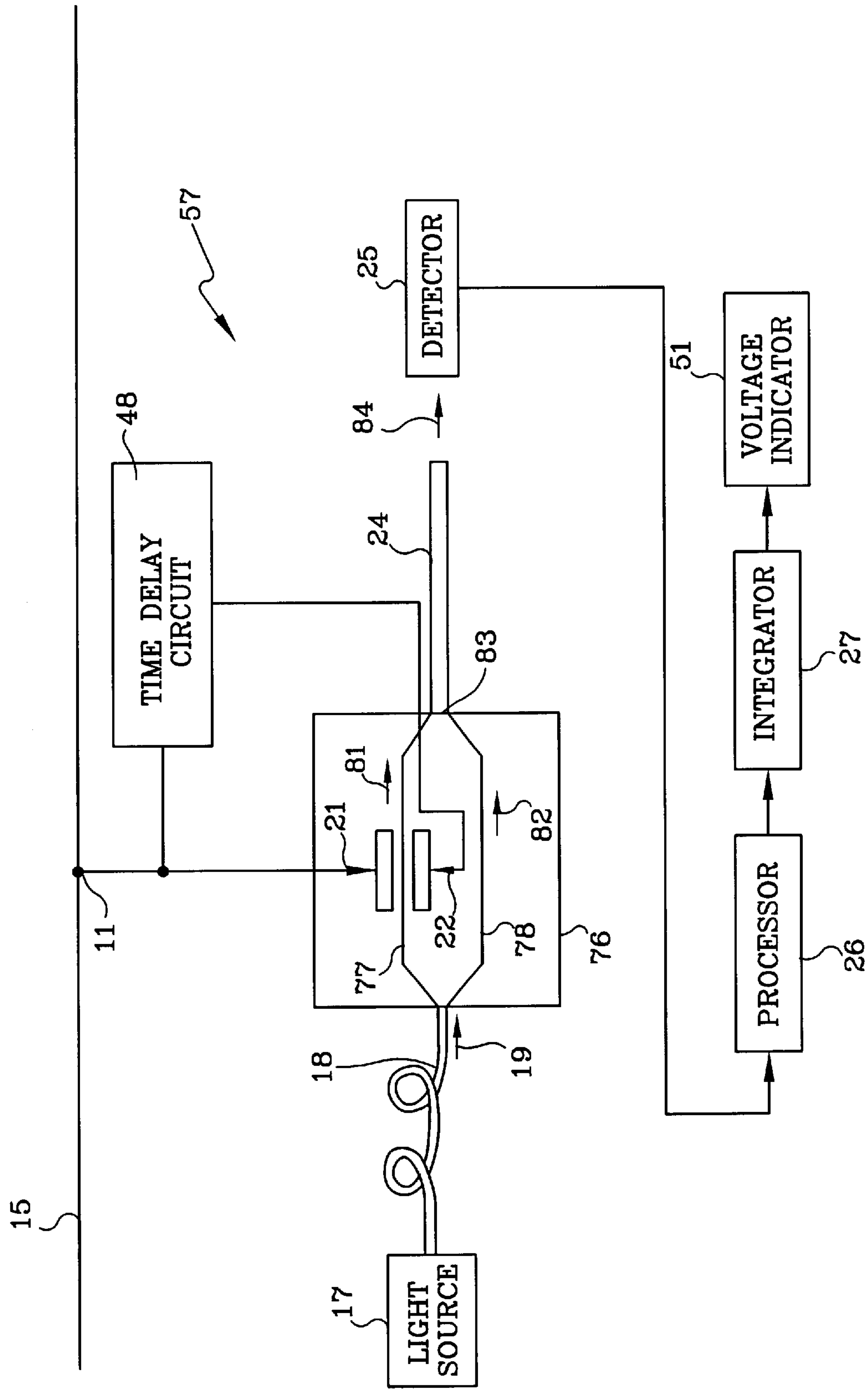
FIG. 7*b* shows a voltage sensor like that of FIG. 7*a*, except that the voltage is measured by monitoring only one point on the voltage line relative to a delay.

Configuration 80 of FIG. 7*b* is like configuration 75 of FIG. 6*b* except it has only one connection 11 to voltage line 15. The line voltage connection is similar to that of configuration 70 in FIG. 6*b*. Optical signal 84 is processed like that of configuration 75 in FIG. 7*a*.

Various combinations of light and electrical signal processing schemes may be utilized in the embodiments of the present invention.

What is claimed is:

1. An optical voltage sensor comprising:

a light source;

an electrical signal delay line having first and second input/output terminating ends, wherein said first input/output terminating end is electrically coupled to a voltage line;

an electro optic sensor coupled to said light source, said electo optic sensor having, a first input electrically coupled to said voltage line, and a second input electrically coupled to said second input/output terminating end of said electrical signal delay line;

a detector coupled to said electro optic sensor; and a processor connected to said detector.

2. The sensor of claim 1, further comprising an integrator connected to said processor.

3. The sensor of claim 2, wherein said electro optic sensor is an integrated optical circuit.

4. The sensor of claim 3, further comprising an integrator connected to said processor.

5. The sensor of claim 4, further comprising a polarizer coupled between said light source and said electro optic sensor.

6. The sensor of claim 5, wherein said electro optic sensor is an integrated optical circuit.

7. An optical voltage sensor comprising:

a light source;

a polarizer proximate to said light source;

an electro optic sensor proximate to said polarizer, having a first input means electrically coupled to a voltage line at a first location for receiving a first electrical signal representative of voltage on said voltage line at a first instant of time, and a second input means electrically coupled to said voltage line for receiving a second electrical signal having a delay relative to the first electrical signal;

a polarization sensitive light splitter proximate to said electro optic sensor, a first detector proximate to said polarization sensitive light splitter;

a second detector proximate to said polarization sensitive light splitter; and a processor connected to said first and second detectors.

8. The sensor of claim 7, further comprising an integrator connected to said processor.

9. The sensor of claim 8, wherein said electro optic sensor is an integrated optical circuit.

10. The sensor of claim 7, further comprising a delay circuit connected between the first and second connections of said electro optic sensor.

11. The sensor of claim 10, further comprising an integrator connected to said processor.

12. The sensor of claim 11, wherein said electro optic sensor is an integrated optical circuit.

13. A method for measuring a voltage of an electrical power line, comprising:

electrically coupling a first electrode of an electro optic sensor to a first location on the electrical power line and electrically coupling a second electrode of the electro optic sensor to a second location on the electrical power line;

radiating light to the electro optic sensor;

converting the light from the electro optic sensor into an electrical signal; and processing the electrical signal into an indication of the voltage on the electrical power line.

14. The method of claim 13, wherein:

an AC voltage wave signal propagates from the first location to the second location, on the electrical power line;

at any one moment a first voltage is present at the first location and a second voltage is at the second location; and a difference of the first voltage and the second voltage at the first and second electrodes of the electro optic sensor, affects a polarization state of the light exiting the electro optic sensor.

15. The method of claim 14, wherein the processing the electrical signal comprises integrating the electrical signal.

16. The method of claim 15, wherein the electro optic sensor is an integrated optical circuit.

17. A method of measuring a voltage of an electrical power line, comprising:

electrically coupling a first electrode of an electro optic sensor to a first location on the electrical power line;

electrically coupling an input of a signal phase delay device to the first location on the electrical power line;

electrically coupling a second electrode of the electro optic sensor to an output of the phase delay device;

radiating light to the electro optic sensor;

converting the light from the electro optic sensor into an electrical signal; and processing the electrical signal into an indication of the voltage on the electrical power line.

18. The method of claim 17, wherein:

at any one moment a first voltage of an AC voltage wave signal is present at the first location;

the phase delay device delays the AC voltage signal from the first location and at the same any one moment a second voltage of the AC voltage signal is present at the output of the phase delay device; and a difference of the first voltage and the second voltage at the first and second electrodes of the electro optic sensor, affects polarization of the light exiting the electro optic sensor.

19. The method of claim 18, wherein the processing the electrical signal comprises integrating the electrical signal.

20. The method of claim 19, wherein the electro optic sensor is an integrated optical circuit.

21. A method for measuring the voltage of an electrical power line, comprising:

electrically coupling a first electrode of an electro optic sensor to a first location on the electrical power line and electrically coupling a second electrode of the electro optic sensor to a second location on the electrical power line, radiating polarized light to the electro optic sensor;

splitting the light exiting the electro optic sensor into a first beam having a first polarization and a second beam having a second polarization;

converting the first beam into a first electrical signal;

converting the second beam into a second electrical signal; and processing the first and second electrical signals into an indication of the voltage on the electrical power line.

22. The method of claim 21, wherein:

an AC voltage wave signal propagates from the first location to the second location, on the electrical power line;

at any one moment a first voltage is present at the first location and a second voltage is at the second location; and a difference of the first voltage and the second voltage at the first and second electrodes of the electro optic sensor, affects polarization state of the light exiting the electro optic sensor.

23. The method of claim 22, wherein the processing comprises integrating at least one of the electrical signals.

24. The method of claim 21, wherein the electro optic sensor is an integrated optical circuit.

25. A method of measuring a voltage of an electrical power line, comprising:

electrically coupling a first electrode of an electro optic sensor to a first location on the electrical power line;

electrically coupling an input of a phase delay device to the first location on the electrical power line;

electrically coupling a second electrode of the electro optic sensor to an output of the phase delay device;

radiating polarized light to the electro optic sensor;

splitting the light exiting the electro optic sensor into a first beam having a first polarization and a second beam having a second polarization;

converting the first beam into a first electrical signal;

converting the second beam into a second electrical signal; and processing the first and second electrical signals into an indication of the voltage on the electrical power line.

26. The method of claim 25, wherein:

at any one moment a first voltage of an AC voltage wave signal is present at the first location;

the phase delay device delays the AC voltage signal from the first location and at the same any one moment a second voltage of the AC voltage signal is present at the output of the phase delay device; and a difference of the first voltage and the second voltage at the first and second electrodes of the electro optic sensor, affects a polarization state of the light exiting the electro optic sensor.

27. The method of claim 26, wherein the processing comprises integrating at least one of the electrical signals.

28. The method of claim 27, wherein the electro optic sensor is an integrated optical circuit.

29. A method for measuring a voltage of an electrical power line, comprising:

sensing a first electrical signal at a first location of the power line;

sensing a second electrical signal at a second location of the power line;

taking a difference of the first and second electrical signals at a particular time and affecting a polarization state of a first light beam with the difference;

splitting the first light beam into a second light beam having a first polarization and a third light beam having a second polarization;

converting the second light beam into a third electrical signal;

converting the third light beam into a fourth electrical signal; and processing the third and fourth electrical signals into an indication of the voltage on the electrical power line.

30. A method for measuring a voltage of an electrical power line, comprising:

sensing a first electrical signal at a first location of the power line;

sensing a second electrical signal at a second location of the power line;

taking a difference of the first and second electrical signals at a particular time and affecting a polarization state of a first light beam in accordance with the difference;

polarizing the first light beam into a second light beam;

converting the second light beam into a third electrical signal; and processing the third electrical signal into an indication of the voltage on the electrical power line.

31. An optical sensor for measuring the voltage on an electric line, comprising:

a light source;

an optical sensor coupled to said light source, and having a first electrical connection to the electric line for receiving a first signal and a second electrical connection for receiving a delayed first signal, the difference of signals affecting a characteristic of light transversing through said optical sensor from said light source;

a detector coupled to said optical sensor for providing a second electrical signal representative of a light output from said optical sensor; and a processor connected to said detector.

32. An optical sensor for measuring a voltage on an electric line, comprising:

a light source;

a Mach Zehnder interferometer, coupled to said light source, having first and second legs and having a modulator on the first leg wherein a first electrode of the modulator is connected to a first point on the electric line and a second electrode of the modulator is connected to a second point on the electric line;

a detector coupled to an optical output of said Mach Zehnder interferometer; and a processor connected to said detector.

33. An optical sensor for measuring a voltage on an electric line, comprising:

a light source;

a Mach Zehnder interferometer, coupled to said light source, having first and second legs, and having a modulator on the first leg, wherein a first electrode of the modulator is connected to a first point on the electric line;

a time delay device having a first terminal connected to the first point on the electric line and a second terminal connected to a second electrode of the modulator;

a detector coupled to said Mach Zehnder interferometer; and a processor connected to said detector.

34. An optical sensor for measuring a voltage on an electrical line, comprising:

a light source;

an electrical signal delay line having first and second input/output terminating ends, wherein said first input/output terminating end is electrically coupled to a voltage line;

an electro optic sensor coupled to said light source, said electro optic sensor having, a first input electrically coupled to said voltage line, and, a second input electrically coupled to said second input/output terminating end of said electrical signal delay line;

a detector coupled to said electro optic sensor; and an integrator connected to said detector.

* * * * *